(12) United States Patent
Hirayanagi

(10) Patent No.: US 6,627,905 B1
(45) Date of Patent: *Sep. 30, 2003

(54) CHARGED-PARTICLE-BEAM MASK-BASED EXPOSURE APPARATUS EMPLOYING A VARIABLE MASK-ILLUMINATION FIELD AND ALIGNMENT AND CALIBRATION METHODS THEREFOR

(75) Inventor: Noriyuki Hirayanagi, Kawasaki (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,975

(22) Filed: Dec. 16, 1998

(30) Foreign Application Priority Data

Dec. 16, 1997 (JP) .............................. 9-364209

(51) Int. Cl.$^7$ ............................... H01J 37/304
(52) U.S. Cl. ............... 250/492.22; 250/492.23
(58) Field of Search .................. 250/492.22, 492.23, 250/505.1

(56) References Cited

U.S. PATENT DOCUMENTS

| | | | | | |
|---|---|---|---|---|---|
| 4,182,958 | A | * | 1/1980 | Goto et al. | 250/492.22 |
| 4,914,304 | A | * | 4/1990 | Koyama | 250/492.2 |
| 5,105,089 | A | * | 4/1992 | Yamada | 250/492.2 |
| 5,334,282 | A | | 8/1994 | Nakayama et al. | |
| 5,886,357 | A | * | 3/1999 | Kojima | 250/492.23 |
| 5,932,884 | A | * | 8/1999 | Aizaki | 250/492.22 |
| 6,034,376 | A | * | 3/2000 | Ema | 250/492.23 |
| 6,121,625 | A | * | 9/2000 | Ito et al. | 250/492.22 |
| 6,127,683 | A | * | 10/2000 | Sasaki et al. | 250/492.22 |

* cited by examiner

*Primary Examiner*—Kiet T. Nguyen
(74) *Attorney, Agent, or Firm*—Klarquist Sparkman LLP

(57) ABSTRACT

A charged-particle-beam exposure apparatus for exposing mask patterns onto a substrate includes a mask illumination system capable of varying the size and/or shape of the beam cross-section (the irradiated or mask-illumination field) at the mask. Initial mask alignment (rough alignment) and calibration are performed by irradiating respective alignment and calibration marks on the mask with a beam having a cross-sectional size smaller than the cross-sectional size of a beam used in the normal exposure process.

9 Claims, 9 Drawing Sheets

CHARGED-PARTICLE-BEAM MASK-BASED EXPOSURE APPARATUS EMPLOYING A VARIABLE MASK-ILLUMINATION FIELD AND ALIGNMENT AND CALIBRATION METHODS THEREFOR

FIELD OF THE INVENTION

This invention relates to charged-particle-beam (CPB) exposure devices for transferring a pattern from a self-supporting thin-film mask onto a substrate, such as a wafer.

BACKGROUND OF THE INVENTION

Mask-based charged-particle-beam (CPB) exposure devices use a charged-particle beam to transfer a desired pattern from a mask to a substrate. The substrate is typically in the form of a charged-particle-sensitive substrate such as a photo-resist-coated wafer or the like.

An example of a conventional CPB exposure device is shown schematically in FIG. 6. The X axis, Y axis, and Z axis are defined as shown in the figure.

In this conventional CPB exposure device, a charged-particle beam in the form of an electron beam EB is emitted from an electron gun 1. The electron beam EB is formed into a constant cross-sectional size and shape by an aperture 3 situated between the electron gun 1 and a mask 2. A position-selection deflector 4 deflects the shaped electron beam EB to irradiate a selected sub-field at a selected position on the mask. The electron beam EB, which has been patterned by passing through the selected sub-field, is then passed through a lens 5 to form a reduced image of the patterned beam at a selected position on a substrate such as a semiconductor wafer 6. The selected position on the wafer 6 is thus exposed, at a particular reduction ratio, with the pattern from the selected sub-field of the mask 2, and the pattern image of the selected sub-field on the mask 2 is transferred to a corresponding position on the wafer 6.

The various other sub-fields on the mask 2 are then sequentially and selectively irradiated by the shaped electron beam EB and exposed on the wafer 6 at respective desired locations. This is accomplished by deflecting the beam with position-selection deflector 4, and by shifting the wafer 6, in the X- and Y-directions, with a substrate stage 7, and by shifting the mask 2 in the X- and Y-directions with a mask stage 8. Patterns formed by irradiation of various individual sub-fields at the mask are positioned on the wafer so as to be aligned and joined or "stitched" together, so that a pattern that is divided into various sub-fields on the mask 2 is formed as a single pattern on the wafer 6. A controller 9 controls the various elements 1, 4, 5, 7, and 8 described above, and a deflector 12, in order to accomplish the pattern transfer.

Note that the substrate stage 7 can generally be moved not only in the X- and Y-directions, but also the Z-direction as well.

Prior to or during the exposure operation described above, device calibrations are performed, such as calibrating the image rotation, image magnification, and the like, in the image-transfer field. This device calibration is typically accomplished by irradiating the electron beam EB onto marks formed at a specific location on the mask 2. An image of the marks on the mask is formed on the wafer 6. The image, formed by the charged-particle beam (electron beam) EB, causes back-scattered electrons and/or other radiation to emanate from corresponding marks on the wafer 6. A detector 10 is employed to detect the electrons and/or other radiation emanating from the corresponding marks on the wafer 6. The controller 9 then calculates control parameters and the like for the lens 5, the deflector 12, and/or similar exposure-device components, based on the detected radiation from the marks on the wafer 6. The control parameters are then saved and/or used to control the wafer stage 7 and/or the mask stage 8.

Also prior to or during the normal exposure operation described above, the mask 2 either is initially installed to the position for exposure, or is swapped and loaded by a mask loader 11. The mask 2 is then initially aligned (also referred to as rough alignment), using alignment marks previously formed on the mask, by a process similar to the process used for device calibration. Namely, the position-selection deflector 4 deflects the electron beam EB so as to irradiate one or more locations, at the plane of the mask 2, where the alignment marks should be positioned. The detector 10 is then used to detect back-scattered electrons and/or other radiation emanating from corresponding marks on the wafer 6 or on the wafer stage 7. The controller 9 then controls the mask stage 8 and/or the wafer stage 7, based on the detected radiation, so as to eliminate any positional shift at the wafer between the image of the alignment marks and the marks on the wafer or wafer stage, thereby rough-aligning the mask.

Note that description of other typical elements generally employed in the illumination system of the electron-beam exposure device to illuminate the aperture 3 and the mask 2 have been omitted above for simplicity. Such elements are known in the art and need not be reviewed here.

In a conventional mask-based CPB exposure device like the example described above, the beam is always shaped to a given constant cross-sectional size and shape by the aperture 3. The constant size and shape of the beam is selected so as to match the size of the sub-fields to be irradiated at the wafer.

SUMMARY OF THE INVENTION

Although an exposure device using a mask and having a constant beam-shape, determined in the manner described above, has no particular detriment during actual pattern exposure and during use with some types of masks, the inventor has found that problems can arise during use of a self-supporting thin-film type mask. These problems will be explained below, with respect to the use of a self-supporting thin-film type mask as shown in FIG.7.

FIG. 7 shows an example of a known self-supporting thin-film type mask. FIG. 7(a) is a schematic plan view. FIG. 7(b) is a cross-sectional view taken along the line A—A' in FIG. 7(a). The mask is constructed from a thin film 21 which scatters electrons at a large scattering angle, and a thick grid-shaped frame 22 which supports the thin film 21 at its bottom surface. Since the frame 22 is thick, when the charged-particle beam irradiates the frame 22, the frame absorbs a significant portion of the incident particles. The process of absorbing incident particles heats the frame. Heating the frame deforms the mask, decreasing the transfer precision of the pattern on the mask.

Pattern-formation fields (transfer fields) 32 are smaller than, and positioned within, respective square fields 31 defined by the frame 22. An irradiation field 33 (shown by the cross-hatching) corresponds to the beam cross-sectional size and shape, and is predetermined to be larger than the pattern-formation fields 32, but smaller than the square fields 31. The electron beam, which has been shaped by the aperture 3 of FIG. 6, sequentially irradiates multiple irradiation fields 33 in the mark of FIG. 7(*a*) (only one irradiation field 33 is shown). While it is not shown in the figure, a desired pattern to be transferred to the wafer 6 is formed by openings or low-scattering-angle areas in each pattern formation field 32 of the thin film 21.

When this type of mask is used in an exposure device, an aperture is provided (not shown in FIG. 6) that blocks the electrons that have been scattered by the non-open and/or non-low-scattering areas of the thin film 21. (Such an aperture would also be used, though not shown, in the devices shown in FIGS. 1, 3, and 4 to be described below.)

If the self-supporting thin-film type mask shown in FIG. 7 is used in the conventional CPB exposure device shown in FIG. 6, there will generally be no problems during normal exposure. However, the inventor has found that the following problems can arise during the device calibration and mask alignment processes discussed above.

First, the problems arising during device calibration will be explained, with reference to FIG. 8. FIG. 8 is a schematic plan view of another portion of the mask shown in FIG. 7, showing irradiation of the electron beam during device calibration.

For use in device calibration, particularly for calibration of image rotation, image magnification, and the like, multiple calibration marks 34 (formed, similar to a pattern feature, by openings or low-scattering-angle areas in the thin film 21) are arranged at selected positions within the transfer field 32. Four such marks are shown in FIG. 8.

It is often desirable to measure some or all of the marks 34 individually, by irradiating each mark individually with the electron beam. For example, the mark uppermost in the figure, mark 34, is shown irradiated individually by the irradiation field 33' in FIG. 8. Because the irradiation field 33' is displaced so as to illuminate only one of the calibration marks 34, a portion of the electron beam irradiates the frame 22 of the mask during calibration. As discussed above, the frame 22 thus absorbs a portion of the electron beam, and generates heat, distorting the mask, thereby decreasing the accuracy and precision of the calibration process.

One possible way to prevent this distortion of the mask is to increase the size of the square field 31 defined by the frame members around the marks 34. (Other fields 31 may be kept the same size.) FIG. 9 is a plan view of structure similar to that of FIG. 8, but with such an enlarged square field 31. Elements in FIG. 9 identical or corresponding to elements in FIGS. 7 and 8 have the same respective reference characters.

The size of the square field 31 of FIG. 9 is increased sufficiently relative to that of FIGS. 7 and 8 such that the irradiation field 33' does not include the frame 22, as shown in FIG. 9. Heating of the frame is thus avoided, but the surface area of the square field 31 that is within the frame 22 (i.e., the area not directly supported by the frame) is then about four times larger than the corresponding area in FIGS. 7 and 8. As a result of the larger unsupported area, the accuracy of the positioning of the marks 34 themselves decreases, thereby decreasing the accuracy of device calibration performed therewith.

The problems arising during initial mask alignment will now be explained with reference to FIG. 10. FIG. 10 is a schematic plan view of still another portion of the mask of FIG. 7. FIG. 10 shows the position of an irradiation field 33" on a mask that is in the initial position as loaded by the mask loader 11. FIG. 10(*a*) shows the position of the irradiation field 33" when the loading accuracy of the mask loader 11 was high, and FIG. 10(*b*) shows the position of the irradiation field 33" when the loading accuracy of the mask loader 11 was low.

A mask-alignment mark 35 (formed as an opening or a low-scattering angle area in the thin film 21) is situated in the transfer field. As mentioned above, when the mask has been loaded, the mark 35 is measured by irradiating the area around and including the location where the mark 35 should be positioned. Back-scattered electrons or other radiation from a corresponding mark on the wafer 6 or on the wafer stage 7 (e.g., a mark made from metallic thin film) are detected by the detector 10, and the relative alignment of the mask and the wafer or the wafer stage is adjusted accordingly.

In the case of the mark 35 on the mask, if the loading precision of the immediately prior loading step is high, the frame 22 of the mask will not be irradiated by the electron beam, as shown in FIG. 10(*a*). But if the loading precision of the loading step is low, the frame 22 will be irradiated by the electron beam, as shown in FIG. 10(*b*), and the frame 22 will absorb a portion of the beam, generating heat and deforming the mask, thereby decreasing the accuracy and precision of the initial mask alignment process.

The size of the square field 31 that is surrounded by the frame may be enlarged so as to prevent the irradiation field 33" irradiated by the electron beam from touching the frame even if the loading precision is low. As discussed above, however, increasing the size of square field 31 decreases the accuracy of the position of the features in the field such as alignment mark 35. Alternatively, loading precision may be increased sufficiently to avoid the degree of inaccuracy shown in FIG. 10(*b*). Increasing loading precision is difficult, however.

In recognition of the above problems arising during device calibration and initial mask alignment, the present invention provides a mask-based CPB exposure device that can change the size and/or shape of the irradiated field at the mask. This invention thus allows the use of self-supporting thin-film type masks, while avoiding the requirement that the mask field in which the device calibration marks are formed be made an especially large size. This invention similarly allows the use of self-supporting thin-film type masks (scattering masks) while avoiding the requirement either that the mask field in which the mask alignment marks are formed be made an especially large size, or that the loading precision of the mask loader be increased.

Means for changing the size and/or shape of the irradiated field at the mask may take various forms.

In one embodiment, the illumination system includes two apertures arranged in succession along the beam path with a deflector positioned between. The deflector deflects the beam, which has been shaped by the first aperture, so as to be selectively shaped and/or sized by the second aperture.

In another embodiment, the illumination system includes a beam-shaping aperture and a variable-magnification lens for projecting the aperture, at a selected magnification, onto the mask. Varying the magnification of the lens varies the size of the beam cross-section at the mask.

In yet another embodiment, the illumination system includes an aperture array positioned in the beam path and having multiple apertures differing from each other in size and/or shape. A means for causing the beam to pass through a selected one of the apertures is also included, and may take the form of a shift mechanism for mechanically shifting the aperture array, or of a deflector for deflecting the beam to pass through the selected aperture. A pre-shaping aperture may be included in the beam path upstream of the aperture array so as to pre-shape the beam to a size and shape just larger than the largest aperture of the aperture array, allowing close spacing of the apertures in the array.

In each of the above-mentioned embodiments, a mask-based charged-particle-beam exposure device includes an illumination system that provides the capability of varying the beam cross-sectional size and/or shape at the mask. This capability may be used to perform calibration of the device, or initial ("rough") alignment of a mask, using a beam having a smaller cross-section than the cross-section of a beam used for normal exposure. This reduces the size of the irradiation field at the mask. The effects of mask heating can thus be avoided, without increasing the unsupported area of the mask around the measurement marks, and without increasing the performance of the mask loader. (Increases in the beam cross-section at the mask could also be caused, if desired.)

Other objects, features, and advantages of the invention will be apparent to those of ordinary skill in the art from the description below, which proceeds with reference to the following figures:

BRIEF DESCRIPTION OF THE DRAWINGS

FIG. 7(*a*) is a partial plan view. FIG. 7(*b*) is a cross-section taken along the line A—A in FIG. 7(*a*).

FIG. 10(*a*) shows the position of the irradiation field 33" when the loading accuracy of the mask loader in the immediately prior loading step was high, and FIG. 10(*b*) shows the position of the irradiation field 33" when the loading accuracy of the mask loader in the immediately prior loading step was low.

DETAILED DESCRIPTION OF EXAMPLE EMBODIMENTS FIRST EXAMPLE EMBODIMENT

Figure 1:
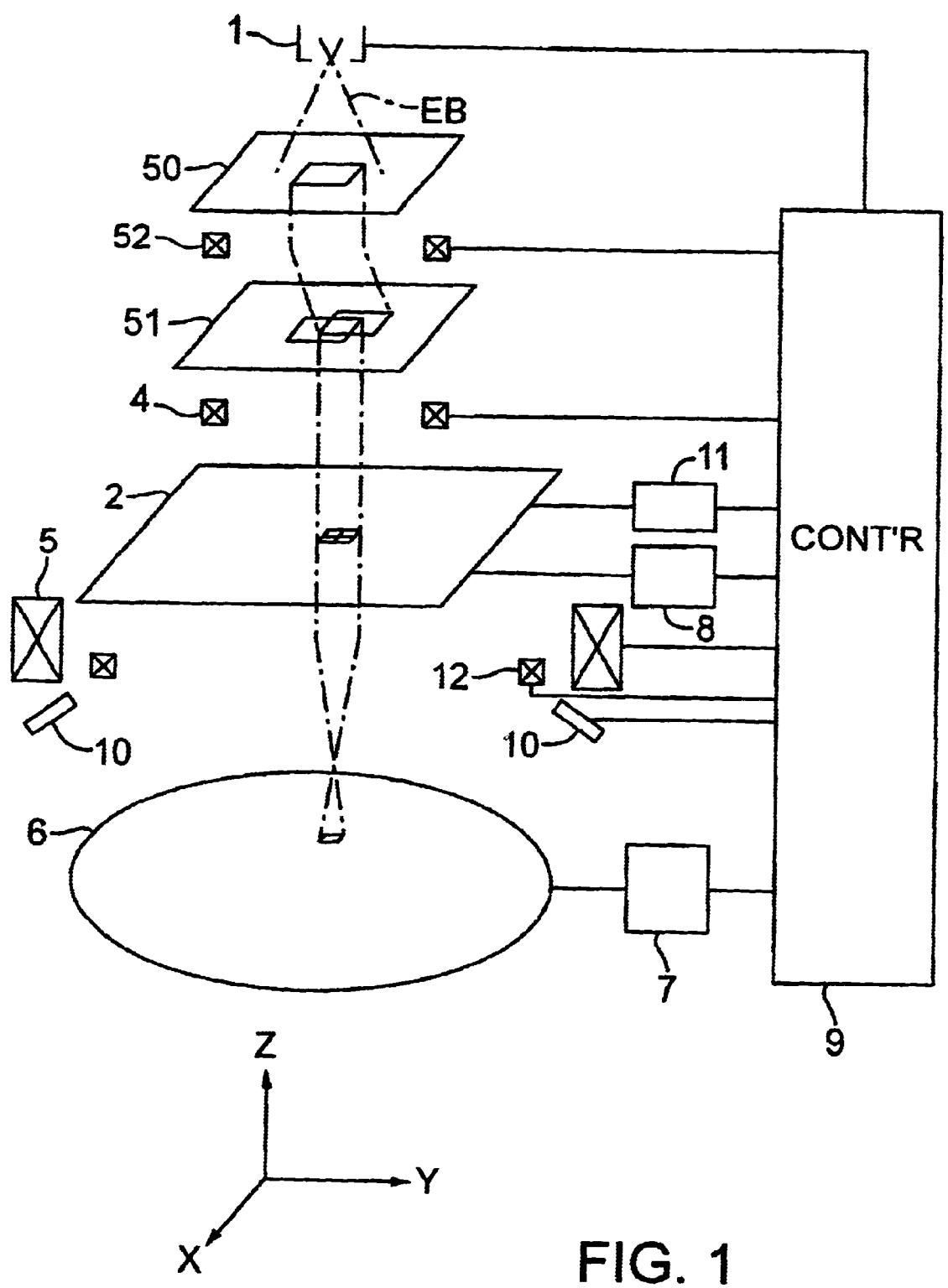
FIG. 1 is a schematic diagram showing the general configuration of a CPB exposure device of a first example embodiment of the present invention.

FIG. 1 is a schematic diagram showing the general configuration of a CPB exposure device of a first example embodiment of the present invention. In FIG. 1, identical or corresponding elements to the elements in FIG. 6 described above have the same respective reference characters. Redundant descriptions will be omitted accordingly.

Figure 6:
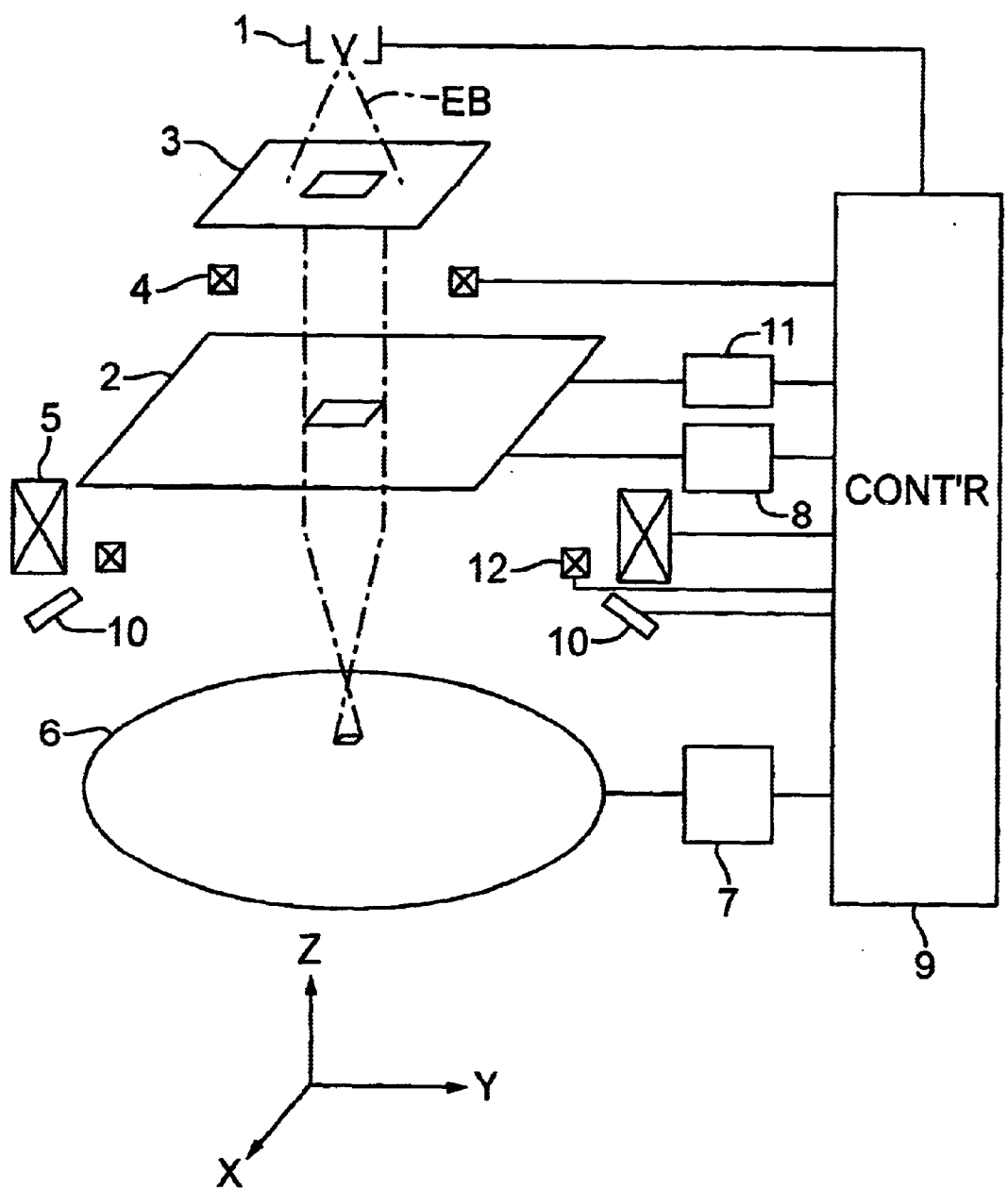
FIG. 6 is a schematic diagram showing the general configuration of a conventional mask-based CPB exposure device.

In the first example embodiment, instead of the aperture 3 as in the device of FIG. 6, first and second apertures 50, 51, are positioned in that order along the path of the electron beam between the electron gun 1 and mask 2. A beam-shaping deflector 52 is positioned between the first aperture 50 and the second aperture 51. Beam-shaping deflector 52 is capable of deflecting the electron beam EB that has been shaped by the first aperture 50. Together, apertures 50, 51, and beam-shaping deflector 52 can select the size and shape of the cross-section of the electron beam EB incident on the mask 2. The size and shape of the cross-section are continuously variable. In this first example embodiment, the second aperture 51 is positioned between the electron gun 1 and the position-selection deflector 4. The beam-shaping deflector 52 is controlled by the control unit 9. The openings in the apertures 50, 51 are each square, but other shapes could of course be used.

In this first example embodiment, the electron beam EB emitted from the electron gun 1 is first shaped into a square beam by the first aperture 50. The size and shape of the electron beam EB irradiated onto the mask can then be adjusted as desired, in a non-stepwise fashion, by setting, via beam-shaping deflector 52, the position at which the square-shaped beam from the first aperture 50 is irradiated onto the second aperture 51. This first example embodiment is thus able to respond in situations in which the need arises to change the size and shape of the irradiation field on the mask 2.

Use of the first example embodiment with a self-supporting thin-film type mask, such as that shown in FIG. 7 described above, will now be explained.

Figure 7A:
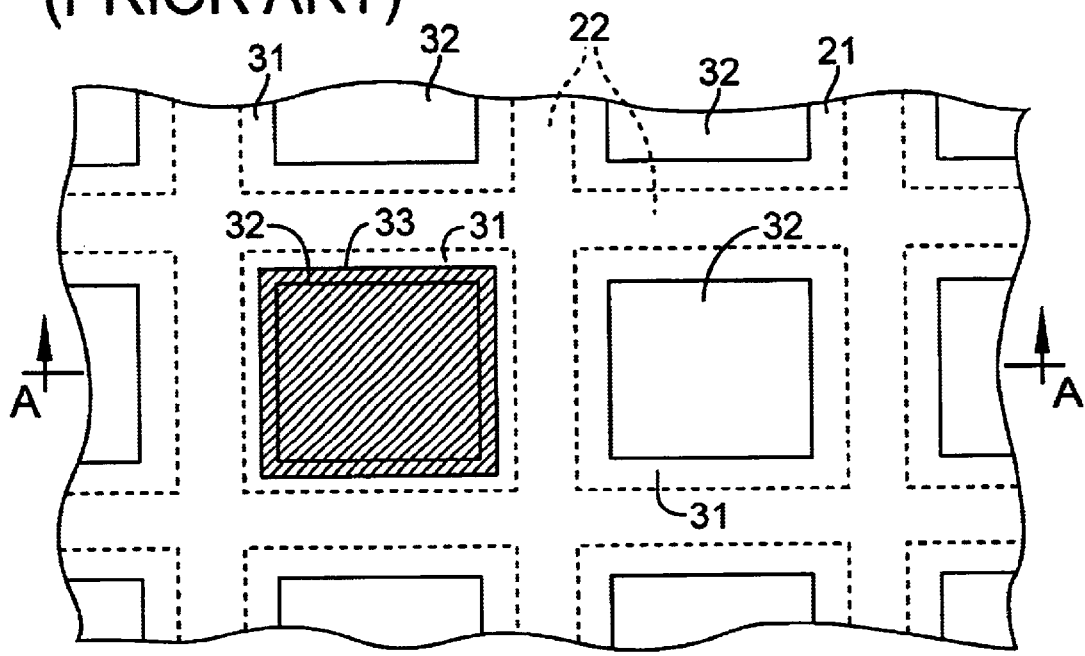
FIG. 7 shows an example of a known self-supporting thin-film type mask.
Figure 7B:
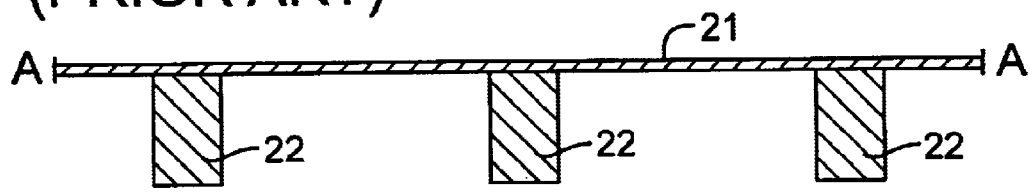

During normal exposure, the beam-shaping deflector 52 of FIG. 1 is controlled such that the electron beam that has passed through the apertures 50 and 51 irradiates, sequentially in each respective square field defined by the mask frame members, a field identical to irradiation field 33 of FIG. 7(*a*). The irradiation field(s) 33 (only one is shown in FIG. 7(*a*)) are larger than and contain the respective pattern formation fields 32, but are smaller than the respective square fields 31.

Figure 2A:
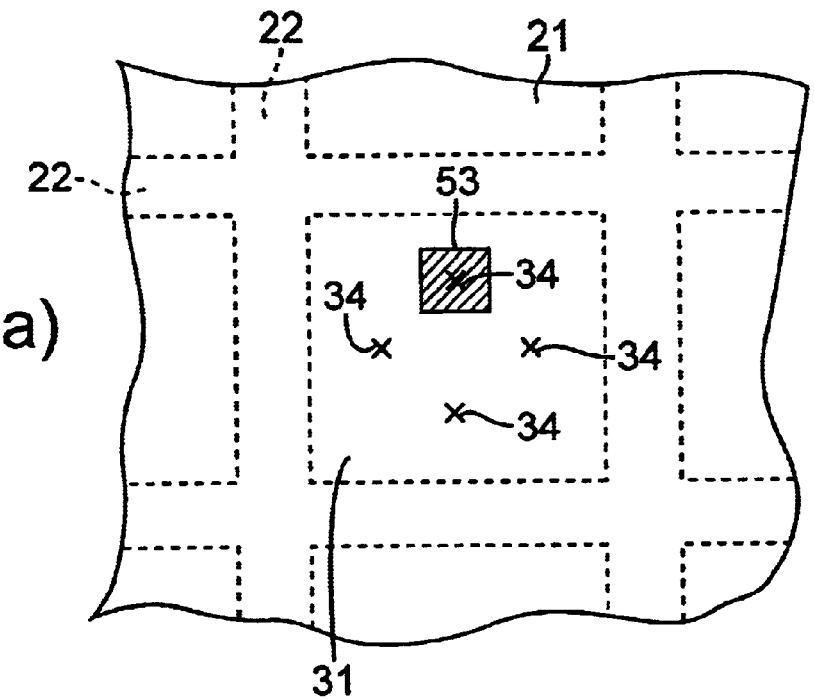
FIGS. 2(*a*) and 2(*b*) are plan views of portions of a mask for use in the device of FIG. 1.
Figure 2B:
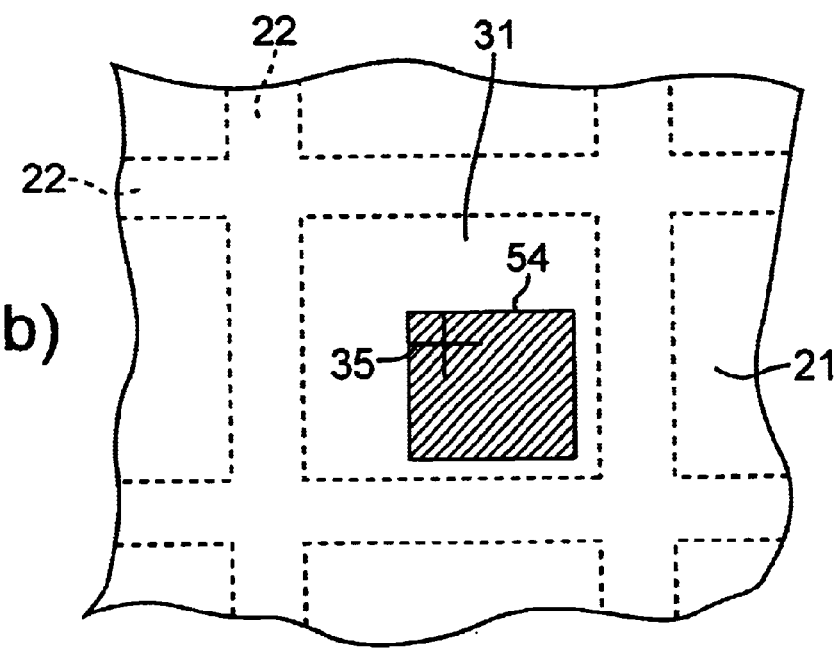
Figure 8:
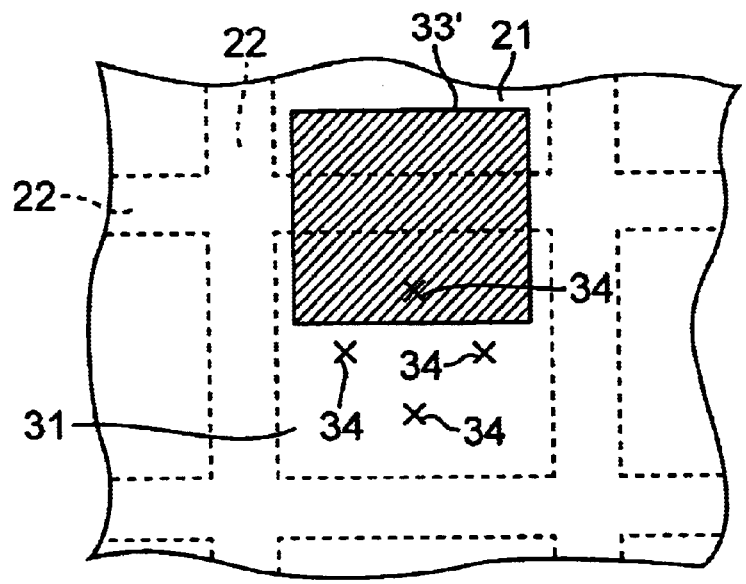
FIG. 8 is plan view of another portion of the mask shown in FIG. 7 illustrating calibration of the CPB exposure device of FIG. 6.
Figure 9:
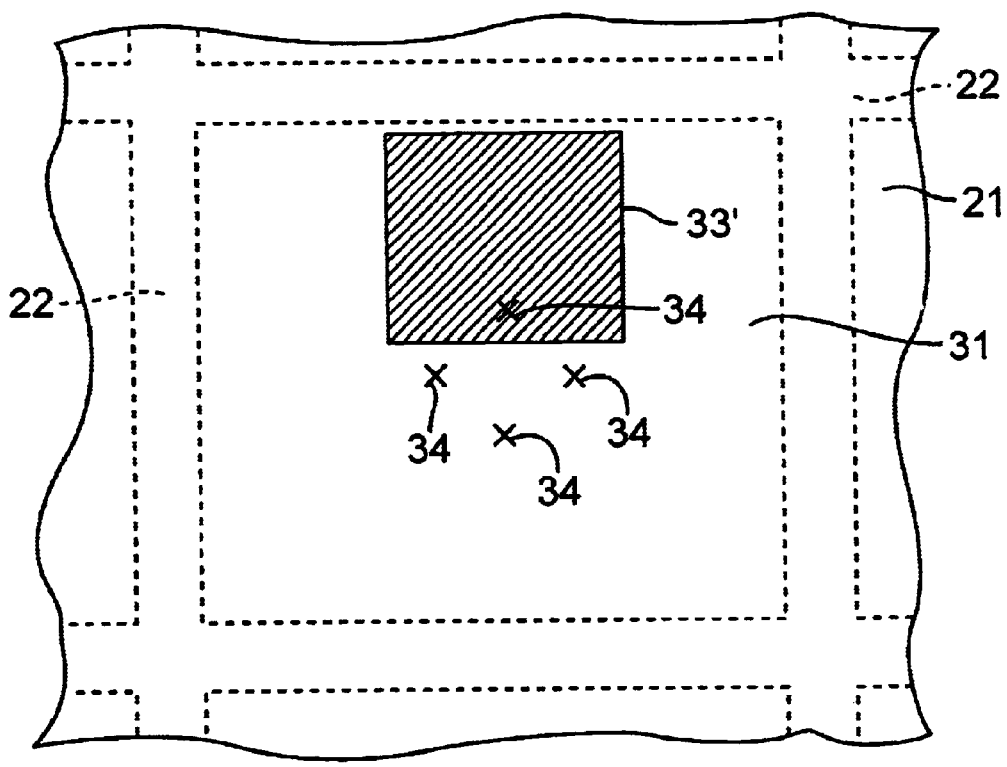
FIG. 9 is a plan view of structure corresponding to the structure shown in FIG. 8, but with an enlarged square field 31.

During device calibration, when the electron beam individually irradiates calibration marks 34, the beam-shaping deflector 52 of FIG. 1 is controlled such that the electron beam produces at the mask an irradiation field that is smaller than the irradiation field 33 used during normal exposure. FIG. 2(*a*) is a plan view of the same portion of a mask as shown in FIG. 8, but showing an example of such a smaller irradiation field in the form of irradiation field 53. By using an electron beam for calibration having a smaller cross-section than that of the electron beam used for normal exposure, the frame 22 is not irradiated, and heating of the mask is prevented without increasing the size of the field 31 in which the device calibration marks 34 are formed.

Figure 10A:
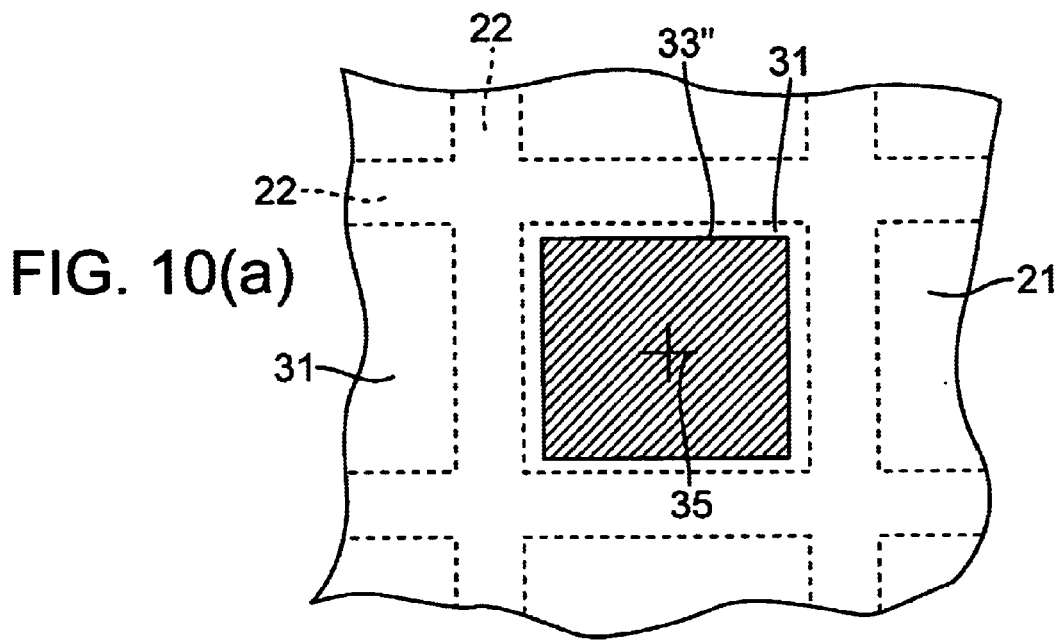
FIG. 10 is a plan view of still another portion of the mask of FIG. 7, showing the position of an irradiation field 33" on the mask while it is in the initial position as loaded by the mask loader in the conventional CPB exposure device of FIG. 6.
Figure 10B:
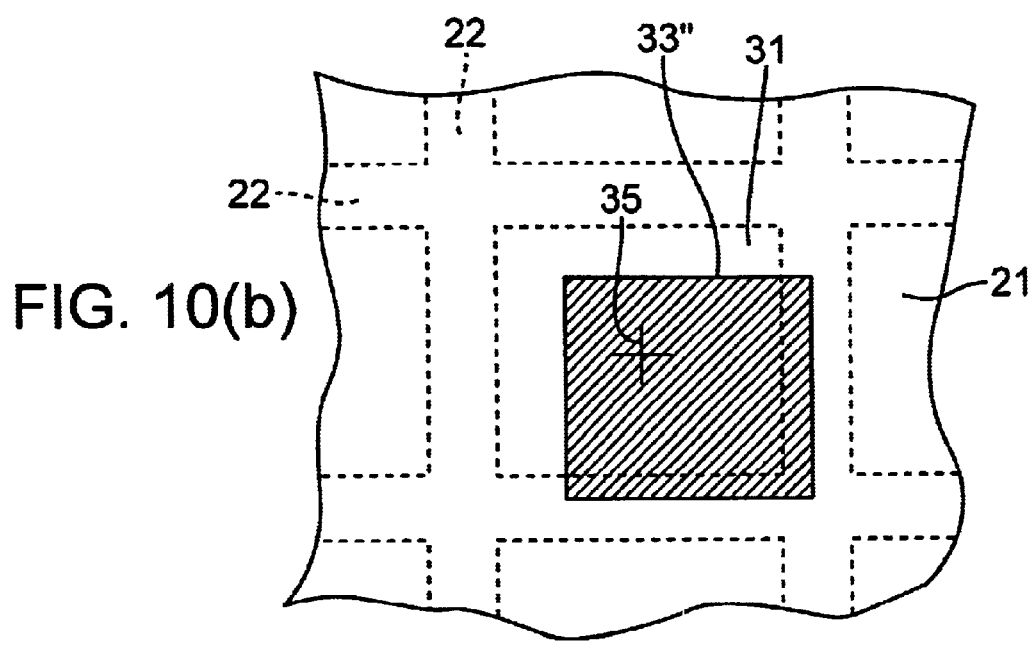

Similarly, during mask alignment, when the electron beam irradiates the alignment mark 35 after the mask has been loaded, the beam-shaping deflector 52 of FIG. 1 is controlled such that the electron beam produces at the mask an irradiation field that is smaller than the irradiation field 33 used during normal exposure. FIG. 2(*b*) is a plan view of the same portion of a mask as shown in FIG. 10, when the mask alignment precision is low (as in FIG. 10(*b*)), but with an example of a smaller irradiation field in the form of irradiation field 54. By using an electron beam for mask alignment having a smaller cross-section than that of the electron beam used for normal exposure, the frame 22 is not irradiated, and heating of the mask is prevented without increasing the size of the field 31 in which the device alignment mark 35 is formed.

Second Example Embodiment

Figure 3:
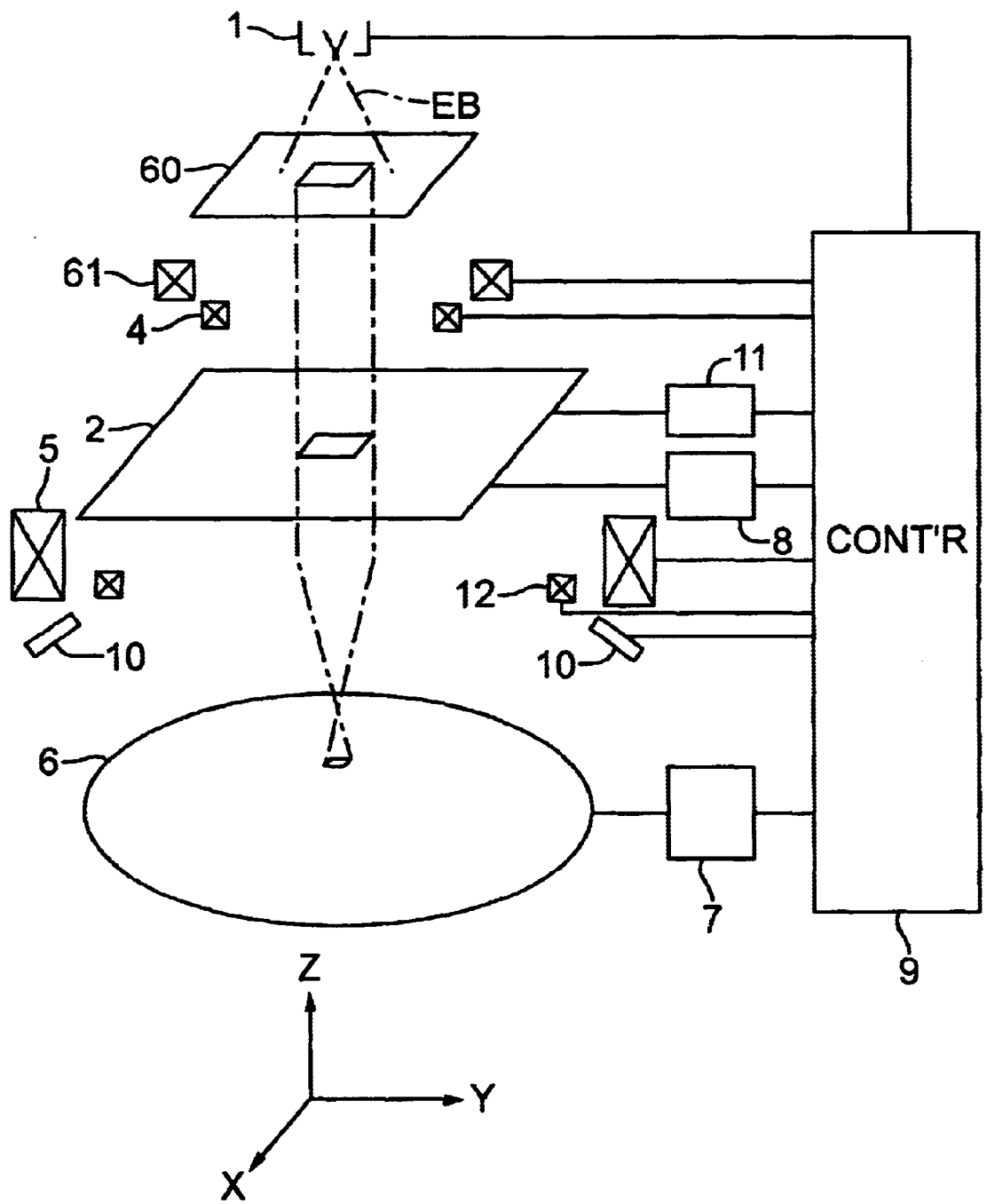
FIG. 3 is a schematic diagram showing the general configuration of a CPB exposure device of a second example embodiment of the present invention.

FIG. 3 is a schematic diagram showing the general configuration of a CPB exposure device of a second example embodiment of the present invention. Elements identical or corresponding to elements in FIGS. 1 and 6 described above have the same respective reference characters. Redundant descriptions are omitted accordingly.

In this second example embodiment, an aperture 60 is positioned between the electron gun 1 and the mask 2. A magnification-variation lens 61 is positioned between the aperture 60 and the mask 2. The magnification-variation lens 61 projects an image of the aperture 60 onto the mask 2. The magnification ratio of the magnification-variation lens 61 is selectable from a continuous range of ratios by the control unit 9.

In this second example embodiment, the electron beam EB emitted from the electron gun 1 is shaped into a square beam by the aperture 60. The magnification-variation lens 61 then forms the resulting square beam into a square beam having a cross-sectional size determined by the magnification ratio of the magnification-variation lens 61. The size of the electron beam EB irradiated onto the mask 2 can thus be selected from a continuous range of sizes by changing the magnification ratio of the magnification variation lens 61 by means of the control unit 9.

Use of the second example embodiment with a self-supporting thin-film type mask, such as that shown in FIG. 7 described above, is similar to that explained above with respect to the first example embodiment. The advantages obtained are also similar.

Third Example Embodiment

Figure 4:
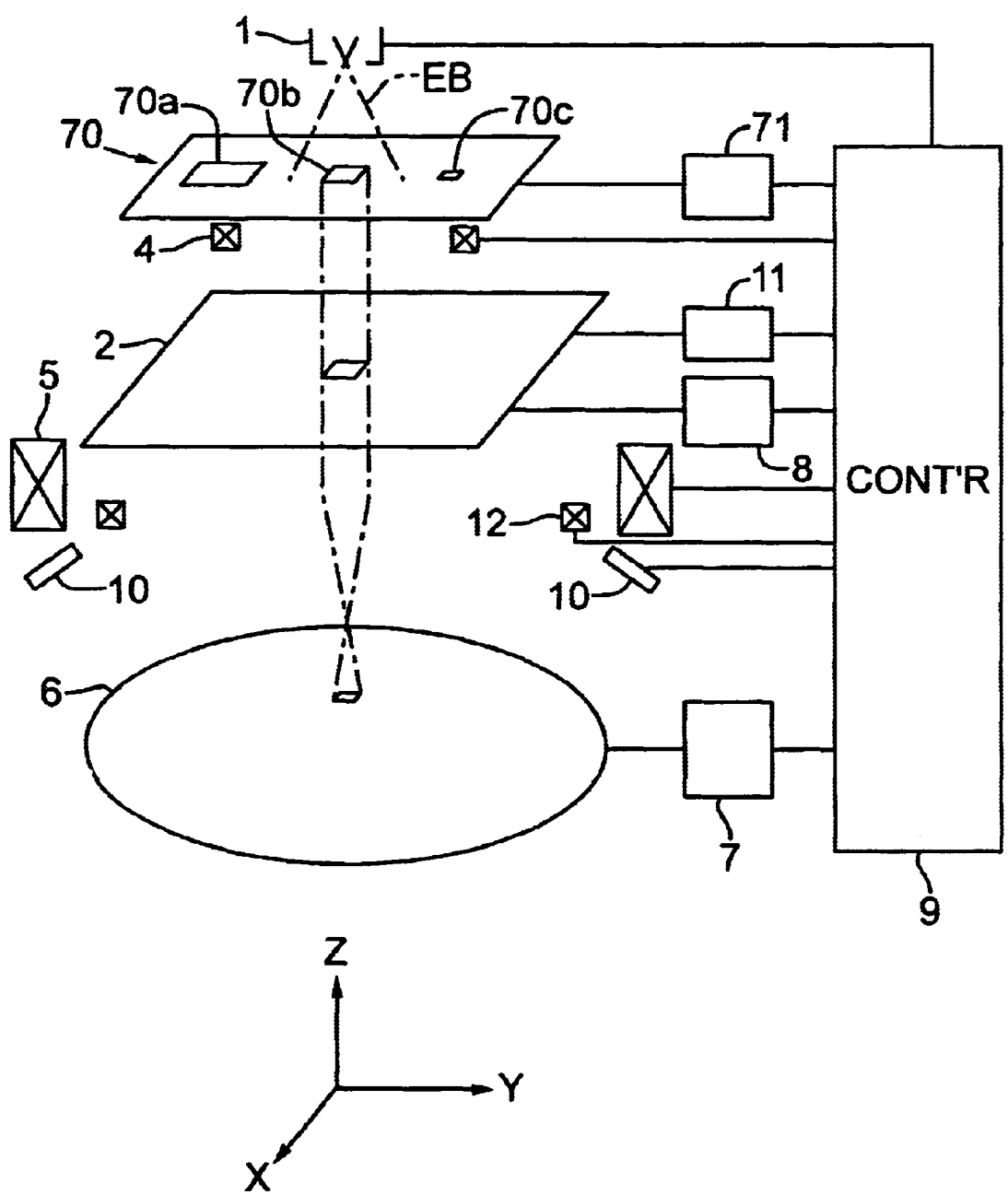
FIG. 4 is a schematic diagram showing the general configuration of a CPB exposure device of a third example embodiment of the present invention.

FIG. 4 is a schematic diagram showing the general configuration of a CPB exposure device of a third example embodiment of the present invention. Elements identical or corresponding to elements in FIGS. 1, 3, and 6 described above have the same respective reference characters. Redundant descriptions are omitted accordingly.

This third example embodiment includes an aperture array 70 with multiple apertures 70a, 70b, 70c arrayed in an X-Y plane. The apertures differ from each other in at least one of aperture size and aperture shape. A shifting mechanism 71 is provided to mechanically move the aperture array 70 so as to position a selected one of the multiple apertures 70a, 70b, 70c to shape the electron beam emanating from the electron gun 1. The shifting mechanism 71 is controlled and operated by the control unit 9, shifting the aperture array 70, in this particular embodiment, in the ±Y direction.

In this third example embodiment, the electron beam EB emitted from the electron gun 1 is shaped into a square beam by the selected one of the multiple apertures 70a, 70b, 70c. The shaped square beam is then irradiated onto the mask 2. The size and/or shape of the electron beam EB irradiated onto the mask 2 can be changed and selected from a discrete set of sizes and/or shapes by operating the shifting mechanism 71 with the control unit 9.

With this third example embodiment, the use of a self-supporting thin-film type mask is similar to that described in connection with the first example embodiment, and similar advantages are obtained.

Although the size and/or shape of the cross-section of the electron beam at the mask cannot be selected from a continuous range as in the first and second example embodiments, the structure and configuration of this third example embodiment are significantly simpler compared to the first and second example embodiments.

Fourth Example Embodiment

Figure 5:
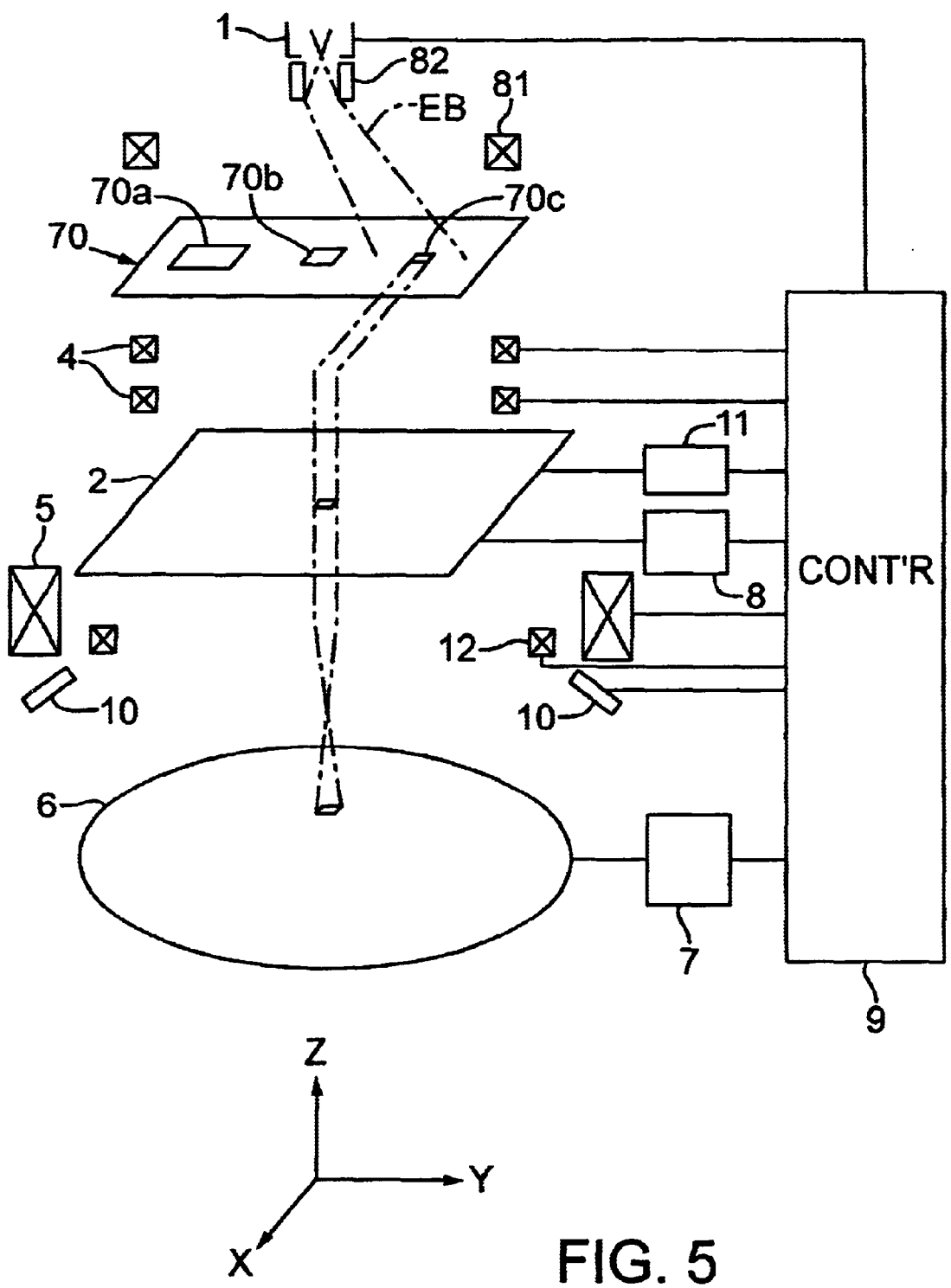
FIG. 5 is a schematic diagram showing the general configuration of a CPB exposure device of a fourth example embodiment of the present invention.

FIG. 5 is a schematic diagram showing the general configuration of a CPB exposure device of a fourth example embodiment of the present invention. Elements identical or corresponding to elements in FIG. 4 described above have the same respective reference characters. Redundant descriptions will be omitted accordingly.

In this fourth example embodiment, the aperture array 70 is fixed, thus no shifting mechanism 71 is included. An aperture-selection deflector 81 is positioned between the electron gun 1 and the aperture array 70. The aperture-selection deflector 81 is controlled by the control unit 9 to deflect the electron beam EB from the electron gun so as to select one of the multiple apertures 70a, 70b, 70c in the aperture array 70, thus causing the electron beam EB to be shaped by the selected aperture.

A pre-shaping aperture 82 is also provided in this example embodiment. The pre-shaping aperture is shaped and positioned to shape the electron beam EB, before it reaches the aperture array 70, so that it has a cross-section that is slightly larger than the largest aperture in the aperture array 70, for example, about 10% larger. The pre-shaping aperture 82 is positioned between the electron gun I and the aperture selection deflector 81. The pre-shaping aperture 82 allows extremely tight spacing of the multiple apertures in the aperture array 70. Tight spacing of the apertures minimizes the deflection amount of the aperture-selection deflector 81. Of course, it is not absolutely necessary to provide the pre-shaping aperture 82.

The pre-shaping aperture 81 could be provided, if desired, in the exposure device of the third example embodiment described above. This would allow tighter spacing of the apertures 70a, 70b, 70c of the third example embodiment, thereby minimizing the amount of movement of the aperture array 70 by the shifting mechanism 71.

In the fourth example embodiment, the pre-shaped electron beam EB leaving the pre-shaping aperture 82 is deflected by the aperture-selection deflector 81 to the selected one of the multiple apertures 70a, 70b, 70c. The beam is shaped into a square beam of a selected size by the selected aperture then irradiated onto the mask 2. The size and/or shape of the electron beam EB irradiated onto the mask 2 can thus be changed and set by appropriately selecting the amount and/or direction of deflection of produced by the aperture-selection deflector 81.

With this fourth example embodiment, the use of a self-supporting thin-film type mask is similar to that described in connection with the example embodiment, and similar advantages are obtained.

As with the third example embodiment, although the size and/or shape of the cross-section of the election beam at the mask cannot be selected from a continuous range as in the first and second example embodiments, the structure and configuration of this fourth example embodiment are significantly simpler compared to the first and second example embodiments.

The exposure apparatus described herein is particularly useful for overcoming the identified problems in alignment and calibration. But the capability of re-sizing and/or per-shaping the electron beam at the mask may be used for other purpose, such as facilitating the illumination of mask with varying-size sub-fields, or illuminating of a single mask with multiple sub-field size.

Whereas the invention has been described with reference to particular embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A charged-particle-beam exposure device, comprising:
   a mask stage for receiving and holding a thin-film mask defining a pattern to be illuminated from upstream and exposed onto a downstream substrate, the mask comprising multiple pattern-formation fields that (i) are separated from one anther by respective portions of a frame, (ii) define respective groups of pattern elements of the pattern, and (iii) individually define at least one respective mask used for at least one of mask alignment and calibration;
   a charged-particle-beam illumination system situated upstream of the mask stage and configured to illuminate the mask with a charged particle beam, the charged-particle-beam illumination system including a beam-varying means for varying at least one of the size and shape of the cross-section of the beam at the mask; and
   a controller connected to the illumination system and beam-varying means and configured to (i) cause the illumination system to illuminate individual pattern-formation fields of the mask with the charged particle beam size and shape to provide an exposure-irradiation field sufficient to cover each respective illuminated pattern-formation field while not impinging on respective elements of the frame, and (ii) cause the illumination system to illuminate, within an individual pattern-formation field, at least one selected respective mask as the beam-varying means reduces at least one of the cross-sectional size and shape of the beam, relative to the exposure-irradiation field, to illuminate the mask while not impinging on respective elements of the frame.

2. The device recited in claim 1, wherein the beam-varying means comprising a first aperture along the beam path, a second aperture along the beam path downstream of the first aperture, and a deflector positioned between the first and second apertures.

3. The device recited in claim 1, wherein the beam-varying means comprises an aperture along the beam path and a magnification-varying lens for projecting an image of the aperture onto the mask at a magnification, the magnification-varying lens being configured so as to vary the magnification at which the image of the aperture is projected onto the mask.

4. The device recited in claim 1, wherein the beam-varying means comprising an aperture array positioned along the beam path, the array having multiple apertures that differ from each other in at least one of size and shape, and means for causing the beam to pass through a selected one of the aperture.

5. The device recited in claim 4, wherein the means for causing the beam to pass through a selected one of the apertures comprises a deflecting the beam to the selected one of the apertures.

6. The device recited in claim 4, wherein the means for causing the beam to pass through a selected one of the apertures comprises a shifting mechanism for shifting the aperature array so as to cause the beam to pass through the selected one of the apertures.

7. The device recited in claim 4, further comprising a pre-shaping aperture positioned along the beam path upstream of the aperture array, the pre-shaping aperture being shape and sized such that the cross-section of the beam at the aperture array is slightly largest aperture of the aperture array.

8. The device recited in claim 1, wherein the mask stage is movable to present, during exposure, successive pattern-formation field of the charged particle beam.

9. The device recited in claim 1, wherein the charged-particle-beam illumination system comprising a pre-shaping aperture configured to size and shape the beam according to the exposure-irradiation field.

* * * * *

UNITED STATES PATENT AND TRADEMARK OFFICE
CERTIFICATE OF CORRECTION

PATENT NO.   : 6,627,905 B1
DATED        : September 30, 2003
INVENTOR(S)  : Noriyuki Hirayanagi It is certified that error appears in the above-identified patent and that said Letters Patent is hereby corrected as shown below:

Column 8,
Line 30, "eletron gun I" should be -- electron gun 1 --.
Line 52, "deflection of produced" should be -- deflection produced --.
Line 56, "example embodiment" should be -- first example embodiment --.
Line 59, "election beam" should be -- electron beam --.

Column 8, line 68 - Column 9, line 1,
"per-shaping" should be -- reshaping --.

Column 9,
Line 2, "purpose" should be -- purposes --.
Line 4, "size" should be -- sizes --.
Line 38, "mask" should be -- mark --.

Column 10,
Lines 2 and 15, "comprising" should be -- comprises --.
Line 22, "a deflecting the beam" should be -- a deflector for deflecting the beam --.
Line 32, "shape" should be -- shaped --.
Line 37, "field of the charged particle beam" should be -- fields of the mask to the charged particle beam --.
Line 39, "comprising" should be -- comprises --.

Signed and Sealed this

Ninth Day of March, 2004

JON W. DUDAS
*Acting Director of the United States Patent and Trademark Office*